US012635175B2

(12) United States Patent
Chandrika Reghunathan et al.

(10) Patent No.: US 12,635,175 B2
(45) Date of Patent: May 19, 2026

(54) POWER SEMICONDUCTOR DEVICE AND METHODS OF PRODUCING A POWER SEMICONDUCTOR DEVICE

(71) Applicant: Infineon Technologies Austria AG, Villach (AT)

(72) Inventors: Manoj Chandrika Reghunathan, Kulim (MY); Devesh Kumar Datta, Butterworth Penang (MY); Eric Graetz, Gelugor Penang (MY); Soon Huat Niew, Klang Selangor (MY)

(73) Assignee: Infineon Technologies Austria AG, Villach (AT)

( * ) Notice: Subject to any disclaimer, the term of this patent is extended or adjusted under 35 U.S.C. 154(b) by 748 days.

(21) Appl. No.: 17/554,536

(22) Filed: Dec. 17, 2021

(65) Prior Publication Data

US 2023/0197846 A1 Jun. 22, 2023

(51) Int. Cl.
H10D 30/65 (2025.01)
H01L 21/265 (2006.01)
(Continued)

(52) U.S. Cl.
CPC ....... H10D 30/657 (2025.01); H10D 30/0281 (2025.01); H10D 62/127 (2025.01);
(Continued)

(58) Field of Classification Search
CPC ........... H01L 29/7824; H01L 29/66681; H01L 29/0696; H01L 29/1045; H01L 21/26586;
(Continued)

(56) References Cited

U.S. PATENT DOCUMENTS 8,546,852 B2 * 10/2013 Takagi ................ H01L 29/7787
257/283
8,637,928 B2 * 1/2014 Obatake .............. H01L 29/0847
257/E29.066

(Continued)

FOREIGN PATENT DOCUMENTS

GB 2563380 B 9/2020
JP 2006120900 A * 5/2006

OTHER PUBLICATIONS

JP2006-120600 with machine translation (Year: 2025).*

*Primary Examiner* — Britt Hanley
*Assistant Examiner* — Victor V Barzykin
(74) *Attorney, Agent, or Firm* — Murphy, Bilak & Homiller, PLLC

(57) ABSTRACT

A semiconductor device includes a silicon-on-insulator (SOI) substrate and transistor cells electrically coupled in parallel to form a power transistor. Each transistor cell includes a source region in a silicon layer of the SOI substrate, a body region in the silicon layer and adjoining the source region, a gate structure configured to control a channel within the body region, a drain region in the silicon layer, and a drift region laterally separating the body region from the drain region. Each gate structure includes a gate electrode separated from the silicon layer by a gate dielectric having a thickness in a range of 20 nm to 60 nm. An effective length of the channel of each transistor cell is in a range of 50 nm to 500 nm. The power transistor has a maximum rated voltage in a range of 5V to 60V. Corresponding methods of producing the semiconductor device are also described.

15 Claims, 20 Drawing Sheets

(51) Int. Cl.

| | |
|---|---|
| *H01L 21/266* | (2006.01) |
| *H10D 30/01* | (2025.01) |
| *H10D 62/10* | (2025.01) |
| *H10D 62/17* | (2025.01) |
| *H10P 30/20* | (2026.01) |
| *H10P 30/22* | (2026.01) |

(52) U.S. Cl.
CPC ......... *H10D 62/307* (2025.01); *H10P 30/222* (2026.01); *H10P 30/204* (2026.01); *H10P 30/21* (2026.01); *H10P 30/22* (2026.01)

(58) Field of Classification Search
CPC ............ H01L 21/26513; H01L 21/266; H10D 30/657; H10D 30/0281; H10D 62/127
See application file for complete search history.

(56) References Cited

U.S. PATENT DOCUMENTS

| | | | |
|---|---|---|---|
| 8,659,081 B2 | 2/2014 | Chen et al. | |
| 9,337,310 B2 * | 5/2016 | Letavic | H01L 29/7816 |
| 9,780,207 B2 | 10/2017 | Li et al. | |
| 10,396,196 B1 * | 8/2019 | Chang | H01L 29/7824 |
| 11,114,562 B2 * | 9/2021 | Verma | H01L 29/0696 |
| 2004/0232483 A1 * | 11/2004 | Kitagawa | H01L 29/7831 |
| | | | 257/E29.136 |
| 2007/0278568 A1 * | 12/2007 | Williams | H01L 29/66106 |
| | | | 257/E29.054 |
| 2008/0182394 A1 * | 7/2008 | Yang | H01L 29/66659 |
| | | | 438/510 |
| 2010/0127326 A1 * | 5/2010 | Lee | H01L 29/7816 |
| | | | 257/E29.256 |
| 2010/0301388 A1 * | 12/2010 | Lin | H01L 29/7393 |
| | | | 257/141 |
| 2013/0105893 A1 * | 5/2013 | Petit | H01L 29/7824 |
| | | | 257/337 |
| 2014/0001517 A1 * | 1/2014 | Eklund | H01L 29/7835 |
| | | | 257/262 |
| 2014/0284714 A1 * | 9/2014 | Miyakoshi | H10D 62/127 |
| | | | 257/337 |
| 2016/0284841 A1 * | 9/2016 | Min | H01L 29/1095 |
| 2016/0343853 A1 * | 11/2016 | Toh | H01L 29/1095 |
| 2017/0194490 A1 * | 7/2017 | Li | H10D 30/0323 |
| 2018/0204944 A1 * | 7/2018 | Schippel | H10D 62/115 |
| 2018/0315773 A1 * | 11/2018 | Dutta | H01L 29/7824 |
| 2019/0109232 A1 * | 4/2019 | Goktepeli | H01L 29/78624 |
| 2019/0214497 A1 * | 7/2019 | Verma | H01L 29/4238 |
| 2021/0234043 A1 * | 7/2021 | Paul | H01L 29/1087 |
| 2022/0254812 A1 * | 8/2022 | Wang | H01L 27/1203 |
| 2023/0301747 A1 * | 9/2023 | Chu | A61C 1/084 |
| | | | 433/75 |

* cited by examiner

POWER SEMICONDUCTOR DEVICE AND METHODS OF PRODUCING A POWER SEMICONDUCTOR DEVICE

BACKGROUND

Medium voltage devices having a maximum rated voltage in a range of 5V to 60V face a fundamental problem in drive current performance per unit area, owing to thicker gate oxides. Although this problem has been addressed to some extent with drift engineering, such as RESURF (Reduced Surface Field) technology, longer channel lengths still contribute a significant fraction of total resistance and hence impact drive current. At the same time, reducing the channel length is difficult in older technology nodes, because of thicker gate oxide and a lack of angled tilted baseline implants. Since power semiconductor devices such as I/O (Input/Output) transistors in gate drivers heavily depend on drive current as a figure of merit, achieving higher current with less die (chip) footprint is of high interest.

SUMMARY

According to an embodiment of a semiconductor device, the semiconductor device comprises: a silicon-on-insulator (SOI) substrate; and a plurality of transistor cells electrically coupled in parallel to form a power transistor, wherein each transistor cell comprises a source region of a first conductivity type in a silicon layer of the SOI substrate, a body region of a second conductivity type opposite the first conductivity type in the silicon layer and adjoining the source region, a gate structure configured to control a channel within the body region, a drain region of the first conductivity type in the silicon layer, and a drift region of the first conductivity type in the silicon layer and laterally separating the body region from the drain region, wherein each gate structure comprises a gate electrode separated from the silicon layer by a gate dielectric having a thickness in a range of 20 nm to 60 nm, wherein an effective length of the channel of each transistor cell is in a range of 50 nm to 500 nm, wherein the power transistor has a maximum rated voltage in a range of 5V to 60V.

According to an embodiment of a method of producing a semiconductor device, the method comprises: implanting a dopant species of a first impurity type into a surface of a silicon layer of a silicon-on-insulator (SOI) substrate to define a drift region; forming a gate structure that comprises a gate electrode separated from the silicon layer by a gate dielectric having a thickness in a range of 20 nm to 60 nm; after defining the drift region, implanting a dopant species of a second impurity type opposite the first impurity type into the surface of the silicon layer and at an angle relative to the surface to define a body region which extends under part of the gate structure; after implanting the dopant species of the second impurity type, annealing the SOI substrate at a temperature of at least 900° C. for more than 1 minute; and implanting a dopant species of the first impurity type into the surface of the silicon layer to define a source region adjacent the body region and a drain region laterally separated from the body region by the drift region.

According to another embodiment of a method of producing a semiconductor device, the method comprises: implanting a dopant species of a first impurity type into a surface of a silicon layer of a silicon-on-insulator (SOI) substrate to define a drift region for a plurality of transistor cells; forming a gate structure for each transistor cell and that comprises a gate electrode separated from the silicon layer by a gate dielectric having a thickness in a range of 20 nm to 60 nm; after defining the drift region, implanting a dopant species of a second impurity type opposite the first impurity type into the surface of the silicon layer and at an angle relative to the surface to define a body region which extends under part of the gate structure for each transistor cell; after implanting the dopant species of the second impurity type, annealing the SOI substrate at a temperature of at least 900° C. for more than 1 minute; implanting a dopant species of the first impurity type into the surface of the silicon layer to define, for each transistor cell, a source region adjacent the body region and a drain region laterally separated from the body region by the drift region; and electrically coupling the transistor cells in parallel to form a power transistor, wherein an effective channel length for each transistor cell is in a range of 50 nm to 500 nm, wherein the power transistor has a maximum rated voltage in a range of 5V to 60V.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a power semiconductor device and methods of producing a power semiconductor device having a maximum rated voltage in a range of 5V to 60V and both a gate dielectric thickness in a range of 20 nm to 60 nm and an effective channel length in a range of 50 nm to 500 nm, yielding higher drive current per unit area, as both current drive capability and cell pitch may be improved. A combination of (i) thin SOI (silicon-on-insulator), e.g., in a range of 200 nm to 400 nm, (ii) high-energy, large-angle tilted implant, and (iii) device layout engineering may be implemented to achieve a very short channel implementation of a medium voltage lateral power device even with a relatively thick gate dielectric. Such a medium voltage device has improved device current performance, combined with Rdson (on-state resistance) reduction, even with a relatively thick gate oxide, e.g., in a range of 46 nm+/−20% as compared to submicron technology nodes with a gate oxide thickness of about 12 nm or less.

Described next, with reference to the figures, are exemplary embodiments of the power semiconductor device and corresponding methods of production.

FIGS. 1A through 1D illustrate partial cross-sectional views of an embodiment of a method of producing a power semiconductor device having a gate dielectric thickness in a range of 20 nm to 60 nm, an effective channel length in a range of 50 nm to 500 nm, and a maximum rated voltage in a range of 5V to 60V.

Figure 1A:
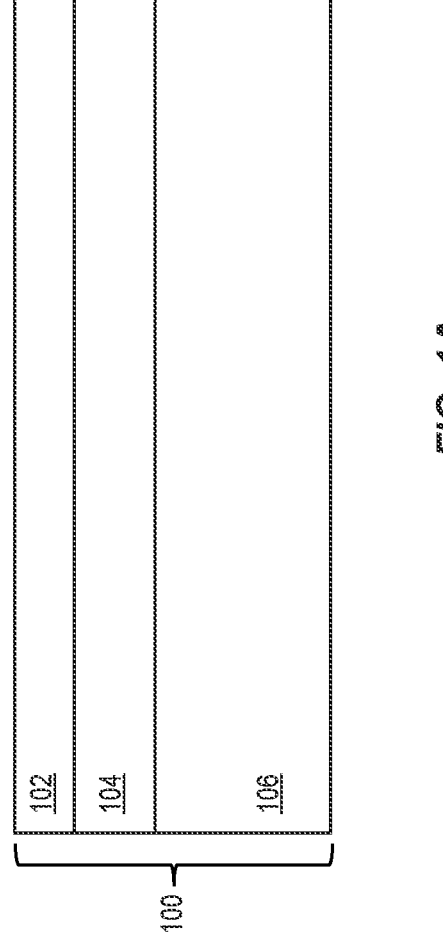
FIGS. 1A through 1D illustrate partial cross-sectional views of an embodiment of a method of producing a power semiconductor device having a gate dielectric thickness in a range of 20 nm to 60 nm, an effective channel length in a range of 50 nm to 500 nm, and a maximum rated voltage in a range of 5V to 60V.

FIG. 1A shows a silicon-on-insulator (SOI) substrate 100 that includes a silicon layer 102 on an electrical insulator 104 such as silicon dioxide, sapphire, etc. In one embodiment, the silicon layer 102 has a thickness in a range of 200 nm to 400 nm. A handle wafer 106 may support the electrical insulator 104 and the silicon layer 102.

Figure 1B:
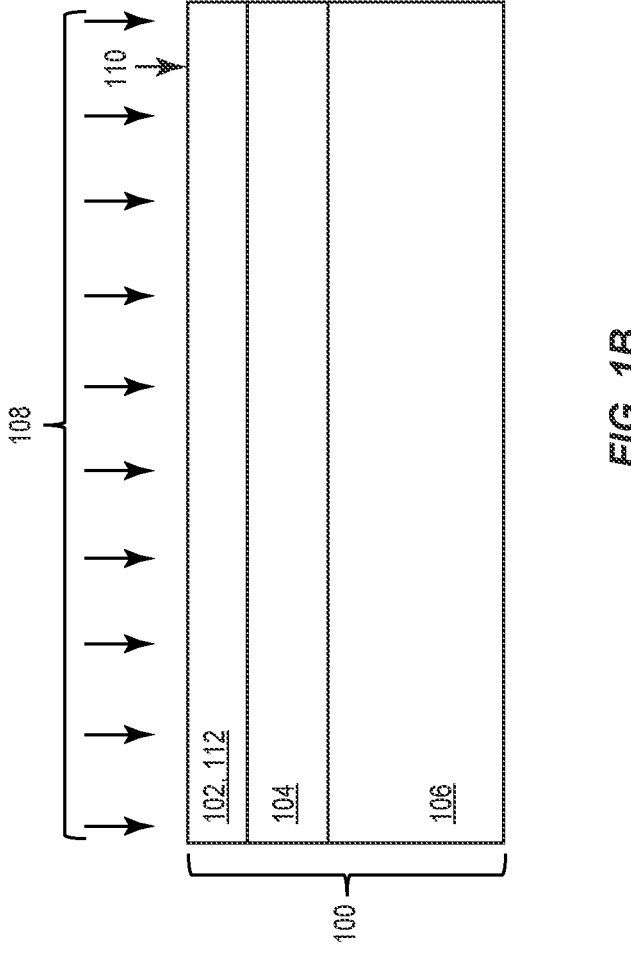

FIG. 1B shows implanting a dopant species 108 of a first impurity type into a surface 110 of the silicon layer 102 of the SOI substrate 100 to define a drift region 112 of a power transistor. In the case of an n-channel power transistor, the first impurity type is n-type (i.e., negative charge carriers or electrons). In the case of a p-channel power transistor, the first impurity type is p-type (i.e., positive charge carriers or holes).

According to the embodiment illustrated in FIGS. 1A through 1D, the drift region 112 is defined before formation of the gate structures. The drift region 112 may be defined this early in the process due to the use of SOI/isolated mesa technology and is not feasible in bulk (non-SOI) technologies. In bulk technologies, the drift extension implants are typically performed after patterning of the gate electrodes.

In one embodiment, a blanket implant mask is formed on the surface 110 of the silicon layer 102 and the dopant species 108 of the first impurity type are implanted through the blanket implant mask to define the drift region 112. The blanket implant mask is devoid of a drift pattern over the active (cell) area of the silicon layer 102. According to this embodiment, the drift region 112 is defined without interruptions or breaks at least in the active area of the silicon layer 102 and has a uniform thickness between the body region and the drain region of each transistor cell and yet to be formed in FIG. 1B.

The active area of the silicon layer 102 is the part of the silicon layer 102 where active transistor cells are formed. An active transistor cell is a transistor cell that contributes to the current flow of the power transistor which is formed by electrically coupling the active transistor cells in parallel. The blanket implant mask is out of view in FIG. 1B, which shows the active area of the silicon layer 102.

Figure 1C:
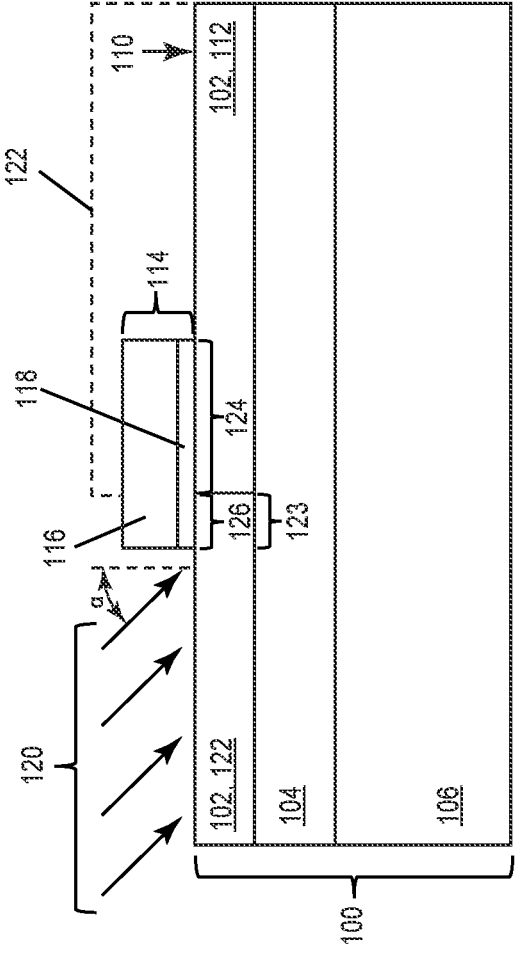

FIG. 1C shows the semiconductor device after forming a gate structure 114. According to the embodiment shown in FIG. 1C, the gate structure 114 is a planar gate structure having a gate electrode 116 separated from the silicon layer 102 by a gate dielectric 118. In one embodiment, the gate electrode 116 comprises polysilicon and has a thickness in a range of 300 nm to 600 nm, and the gate dielectric 118 comprises oxide and has a thickness in a range of 46 nm+/−20%. More generally, the gate dielectric 118 may have a thickness in a range of 20 nm to 60 nm.

FIG. 1C also shows (masked) implanting a dopant species 120 of a second impurity type opposite the first impurity type into the surface 110 of the silicon layer 102 and at an angle α relative to the surface 110 to define a body region 122 which extends under part of the gate structure 114. In the case of an n-channel power transistor, the second impurity type is p-type. In the case of a p-channel power transistor, the second impurity type is n-type.

The dopant species 120 of the second impurity type may be implanted into the surface 110 of the silicon layer 102 and at an angle α relative to the surface 110 by forming an angled implant mask 122 on the surface 110 of the silicon layer 102. The angled implant mask 122 shields a drain-facing part 124 of the silicon layer 102 disposed under the gate structure 114 and exposes a source-facing part 126 of the silicon layer 102 disposed under the gate structure 114. The dopant species 120 of the second impurity type is implanted through the angled implant mask 122 such that the dopant species 120 of the second impurity type extends into the source-facing part 126 of the silicon layer 102 but not into the drain-facing part 124 of the silicon layer 102. For example, the angle α at which the dopant species 120 of the second impurity type is implanted into the surface 110 of the silicon layer 102 may be in a range of 40 to 50 degrees relative to the surface 110.

Separately or in combination, a total dose of the dopant species 120 of the second impurity type is delivered to the silicon layer 102 in 4 rotational steps of 45 degrees each with each rotation delivering a quarter of the total dose to the silicon layer 102, e.g., using a quad angle halo implantation process. Compared to sub-micron technologies, the source-drain pitch is larger in FIGS. 1A through 1D. Accordingly, photoresist shadowing is avoided and the self-aligned channel area may be effectively doped via the implant process shown in FIG. 1C.

For a gate dielectric 118 having a thickness in a range of 20 nm to 60 nm, a high energy implant, e.g., at an energy of about 80 keV to 140 keV is used in conjunction with an implant angle α in a range of 40 to 50 degrees to ensure a minimum effective channel length. The energy and angle α of the implant are selected to implant through the relatively thick gate dielectric 118 and the edge of the gate electrode 116. An ultra-short channel device having an effective channel length, e.g., in a range of 50 nm to 100 nm with a gate dielectric thickness in a range of 20 nm to 60 nm could trigger higher Vt (threshold voltage) values with higher halo implantation dose. Proper Vt control and off current adjustments may be implemented for such devices.

After implanting the dopant species 120 of the second impurity type, the SOI substrate 100 is annealed at a temperature of at least 900° C. for more than 1 minute to form the channel area 123 of each active transistor. According to this embodiment, a longer anneal in the range of more than 1 minute is used instead of an RTA (rapid thermal annealing) which lasts for only a few seconds. For example, the annealing at a temperature of at least 900° C. may be sustained in a range of 30 to 45 minutes or even hours. The longer anneal (oxidation) process ensures an effective channel length in a range of 50 nm to 500 nm is obtained by sufficient dopant drive-in, thereby avoiding punch through.

Figure 1D:
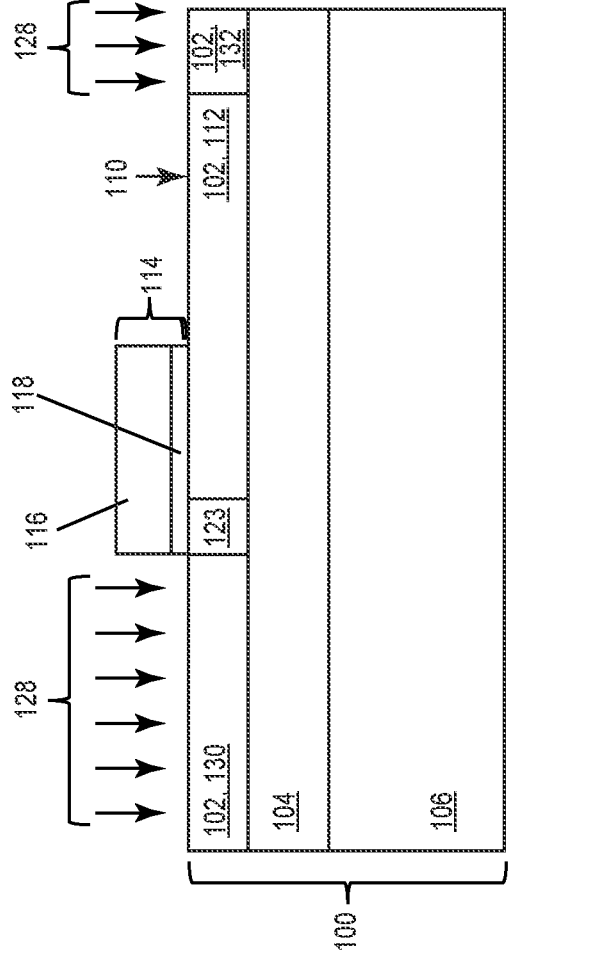

FIG. 1D shows (masked) implanting a dopant species 128 of the first impurity type into the surface 110 of the silicon layer 102 to define a source region 130 adjacent the body region 122 and a drain region 132 laterally separated from the body region 122 by the drift region 112 for each active transistor cell. According to this embodiment, the power semiconductor device is a lateral device in that the main current flow path between the source and drain regions 130, 132 occurs along the front side of the device and not between the front and back sides of the device. The gate structure 114 is illustrated as a planar gate formed on the surface 110 of the silicon layer 102 but instead may be a trench gate formed in the silicon layer 102.

FIGS. 2A through 2D illustrate partial cross-sectional views of another embodiment of a method of producing a power semiconductor device having a gate dielectric thickness in a range of 20 nm to 60 nm, an effective channel length in a range of 50 nm to 500 nm, and a maximum rated voltage in a range of 5V to 60V.

Figure 2A:
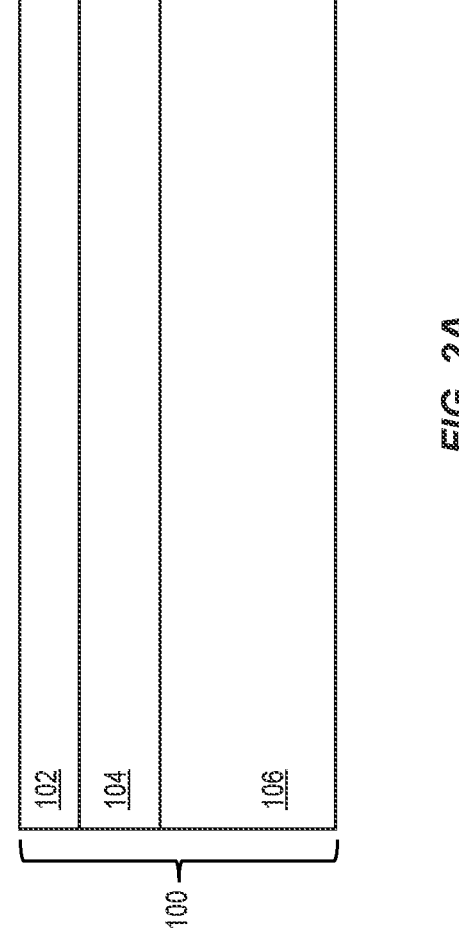
FIGS. 2A through 2D illustrate partial cross-sectional views of another embodiment of a method of producing a power semiconductor device having a gate dielectric thickness in a range of 20 nm to 60 nm, an effective channel length in a range of 50 nm to 500 nm, and a maximum rated voltage in a range of 5V to 60V.

FIG. 2A, like FIG. 1A, shows an SOI substrate 100 that includes a silicon layer 102 on an electrical insulator 104 such as silicon dioxide, sapphire, etc. The silicon layer 102 may have a thickness in a range of 200 nm to 400 nm, for example.

Figure 2B:
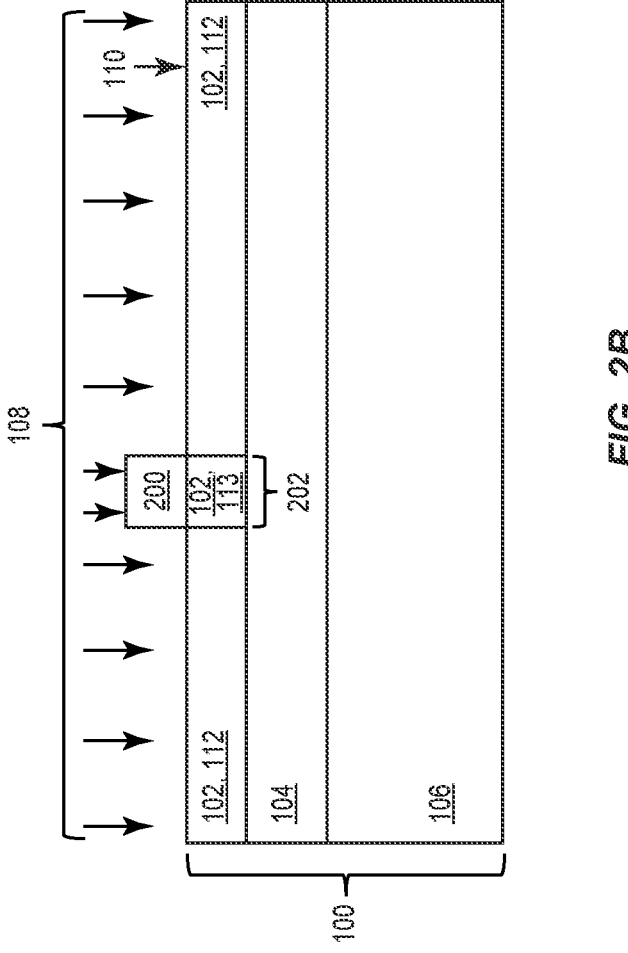

FIG. 2B, like FIG. 1B, shows implanting a dopant species 108 of a first impurity type into a surface 110 of the silicon layer 102 of the SOI substrate 100 to define a drift region 112 of a power transistor before forming the gate structures. Different than the embodiment shown in FIG. 1B, the embodiment shown in FIG. 2B includes forming a patterned drift implant mask 200 on the surface 110 of the silicon layer 102. The patterned drift implant mask 200 includes a channel pattern 202 associated with a channel area of each active transistor cell. The channel area is the part of the body region 122 disposed under the gate structure 114. The dopant species 108 of the first impurity type is implanted through the patterned drift implant mask 200 to define the drift region 112. The channel pattern 202 of the patterned drift implant mask 200 shields the channel area of each active transistor cell from the dopant species 108 of the first impurity type. In one embodiment, the channel pattern 202 of the patterned drift implant mask 200 has a CD (critical dimension) of 0.8 or lower.

Accordingly, and different than the embodiment illustrated in FIG. 1B, an intrinsic or undoped Si region 113 remains in part of the channel area upon defining the drift region 112. This region is considered 'intrinsic' or 'undoped' in that almost or even none of the drift implant enters the part of the channel area shieled by the channel pattern 202 of the patterned drift implant mask 200. The part of the channel area shielded by the channel pattern 202 of the patterned drift implant mask 200 may have a background doping level but the background doping level is relatively unaffected by the drift implantation.

Use of the patterned drift implant mask 200 allows the subsequent angled body implant to further define the overall channel area, a portion of which includes the region 113 that remained intrinsic or undoped upon defining the drift region 112, as explained above. Accordingly, use of the patterned drift implant mask 200 results in further improved punch through protection and/or allows for an even shorter effective channel length. For example, the effective channel length may be in a range of 50 nm to 100 nm by using the patterned drift implant mask 200. The effective channel length may be in a range of 100 nm to 500 nm by using the blanket drift implantation process illustrated in FIG. 1B.

Figure 2C:
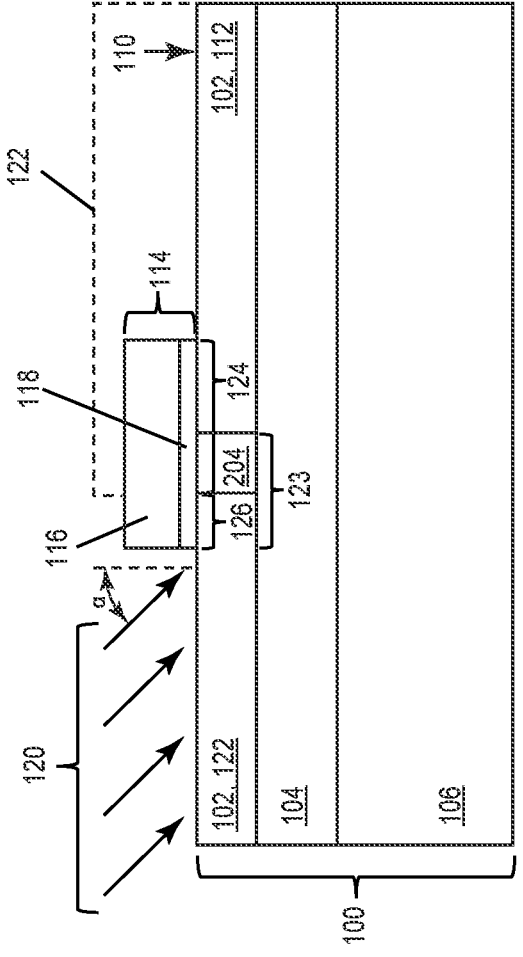

FIG. 2C, like FIG. 1C, shows the semiconductor device after the gate structures 114 are formed and during the (masked) implanting of the dopant species 120 of the second impurity type into the surface 110 of the silicon layer 102 at an angle α relative to the surface 110 to define the body region 122 of each active transistor cell. According to the embodiment illustrated in FIGS. 2A through 2D, the patterned drift implantation process shown in FIG. 2B yields a transition region 204 associated with the channel pattern 202 of the patterned drift implant mask 200 and into which some of the dopant species 120 of the second impurity type diffuse by the anneal drive-in process to define the overall channel area 123. Because a region 113 of the channel area was protected from the earlier drift implant by the patterned drift implant mask 200, the angled body region dopant implant process shown in FIG. 2C results in further improved channel length control in the channel area 123, thereby providing improved off current control.

Figure 2D:
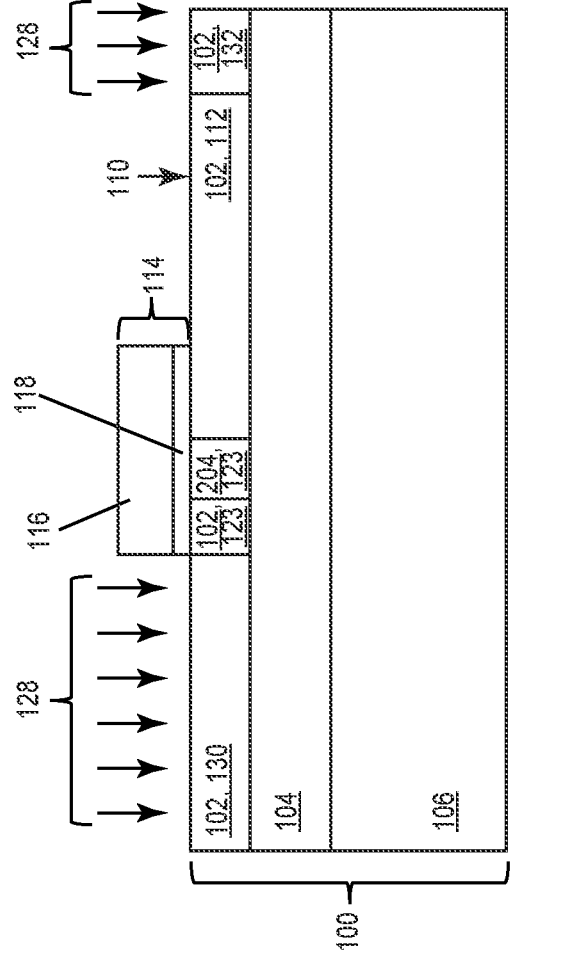

FIG. 2D, like FIG. 1D, shows (masked) implanting a dopant species 128 of the first impurity type into the surface 110 of the silicon layer 102 to define the source region 130 adjacent the body region 122 and the drain region 132 laterally separated from the body region 122 by the drift region 112 for each active transistor cell.

The embodiments illustrated in FIGS. 1A through 1D and in FIGS. 2A through 2D use a thin SOI silicon layer 102 with a high energy angled implant to form the channel area 123 of the active transistor cells for a medium voltage power semiconductor device, instead of using an STI (shallow trench isolation) process with a spacer-based submicron implementation. To make such a non-submicron/non-STI implementation successful, the drift extension implants are performed much earlier in the process. For example, the drift region 112 may be defined before forming the gate structures 114, as shown in FIGS. 1B and 2B. A patterned drift implant mask 200 may be applied in the active area of the silicon layer 102, e.g., as shown in FIG. 2B, for improved channel length control. Regardless of whether a blanket or patterned drift implant mask is used to define the drift region 112, utilizing a long furnace anneal for more than 1 minute to drive-in the body implant provides sufficient channel length control. The angled halo implant process, the long (more than 1 minute) anneal, the blanket or patterned drift implantation process, and the thin SOI described herein each provide about 20% control over the effective channel length.

Described next are embodiments of the implant masks used during the methods illustrated in FIGS. 1A through 1D and FIGS. 2A through 2D.

FIGS. 3A through 3F illustrate partial top-down plan views of the implant masks used during the method illustrated in FIGS. 1A through 1D, in a region of two active transistor cells 'TC'. Each transistor cell includes a source region 130 of the first conductivity type in the silicon layer 102 of the SOI substrate 100, a body region 122 of the second conductivity type in the silicon layer 102 and adjoining the source region 130, a gate structure 114 configured to control a channel within a channel area 123 of the body region 122, a drain region 132 of the first conductivity type in the silicon layer 102, and a drift region 112 of the first conductivity type in the silicon layer 102 and laterally separating the body region 122 from the drain region 132. The transistor cells are electrically coupled in parallel to form a power transistor, e.g., via a common source metallization, a common drain metallization, and a common gate metallization. The gate dielectric 118 of each transistor cell has a thickness in a range of 20 nm to 60 nm, the effective length of the channel of each transistor cell is in a range of 50 nm to 500 nm, and the power transistor formed by the transistor cells has a maximum rated voltage in a range of 5V to 60V. As shown in FIGS. 3B through 3F, the device may have stripe-shape gate structures 114 which extend lengthwise in parallel with one another. However, another gate layout may be used.

Figure 3A:
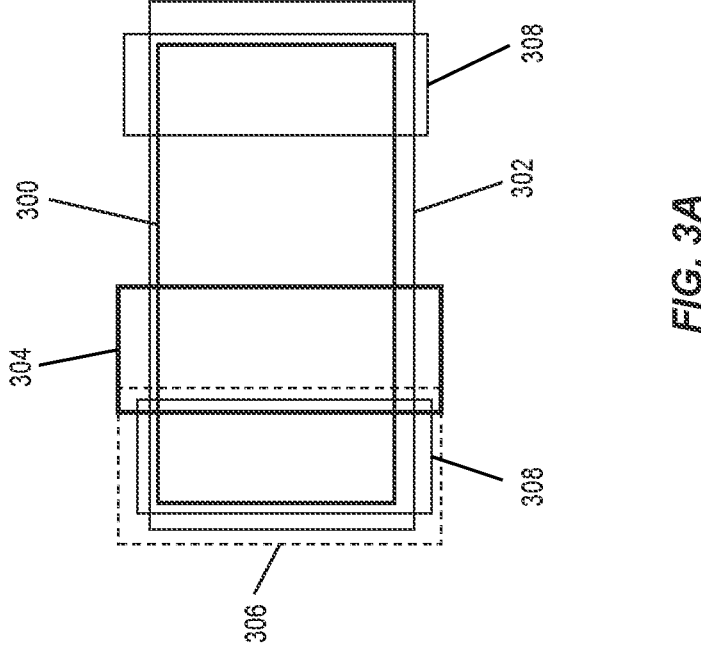
FIGS. 3A through 3F illustrate partial top-down plan views of the implant masks used during the method illustrated in FIGS. 1A through 1D, in a region of two active transistor cells TC.

FIG. 3A schematically shows the implant masks used during the method illustrated in FIGS. 1A through 1D, overlaid with the active area 300 in the region of one transistor cell. The masks used include a blanket drift implant mask 302 for defining the drift region 112, a gate mask 304 for defining the gate structures 114, an angled halo implant mask 306 for defining the body region 122 and corresponding channel area 123, and a source/drain mask 308 for defining the source and drain regions 130, 132. Any standard photolithography process may be used to form the masks 302, 304, 306, 308.

Figure 3B:
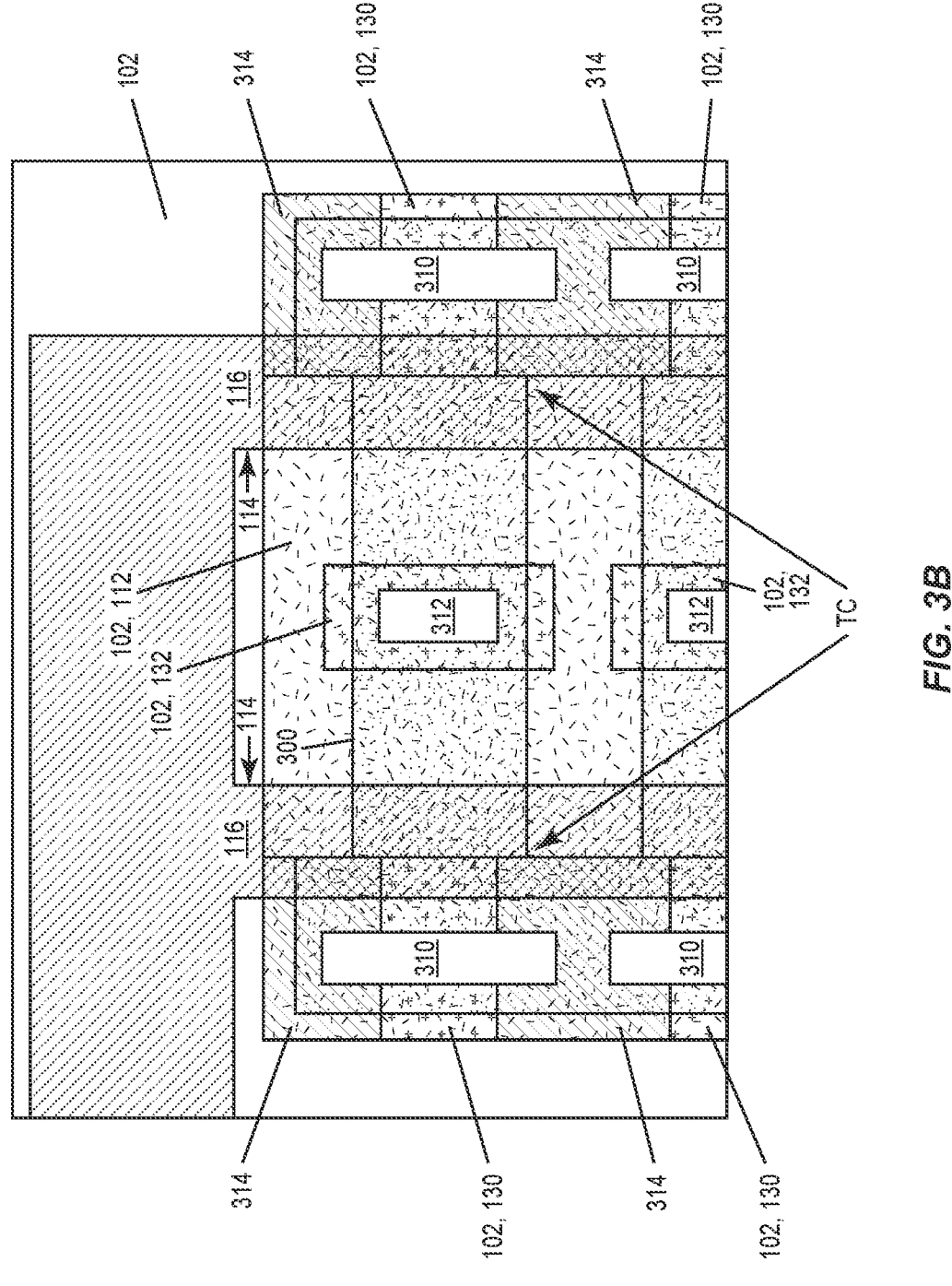

FIG. 3B shows the device produced using the masks 302, 304, 306, 308 shown in FIG. 3A, in a region of two active transistor cells TC. FIG. 3B also shows source/body contacts 310 and drain contacts 312 for the source and drain regions 130, 132, respectively, and highly doped body contact regions 314 formed in the SOI silicon layer 102 for providing an Ohmic connection to the body regions 122 which are out of view in FIG. 3B. In the case of an n-channel device, the highly doped body contact regions 314 are p+ doped. In the case of a p-channel device, the highly doped body contact regions 314 are n+ doped.

Figure 3C:
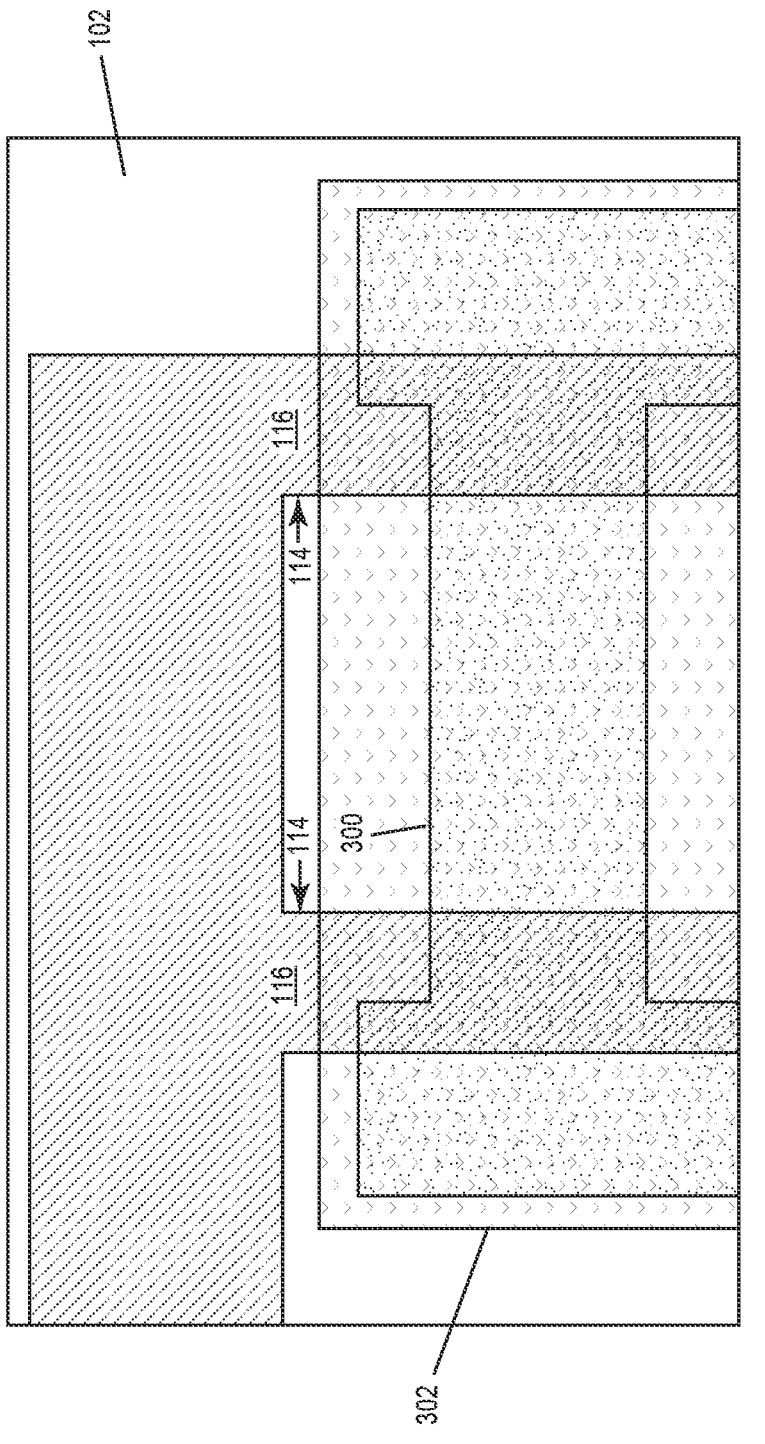

FIG. 3C shows the blanket drift implant mask 302. The cross-hatched part of the blanket drift implant mask 302 illustrated in FIG. 3C is the part of the mask 302 that allows the dopant species 108 of the first impurity type to be implanted into the surface 110 of the silicon layer 102 to define the drift region 112 in the active area 300. According to this embodiment, the blanket drift implant mask 302 is not patterned/slotted over the active area 300. Accordingly, the drift region 112 may have a uniform thickness between the body region 122 and the drain region 132 of each transistor cell TC. As explained above, the drift region 112 may be defined in the silicon layer 102 before formation of the gate structures 114. The gate structures 114 are shown in FIG. 3C as a point of reference.

Figure 3D:
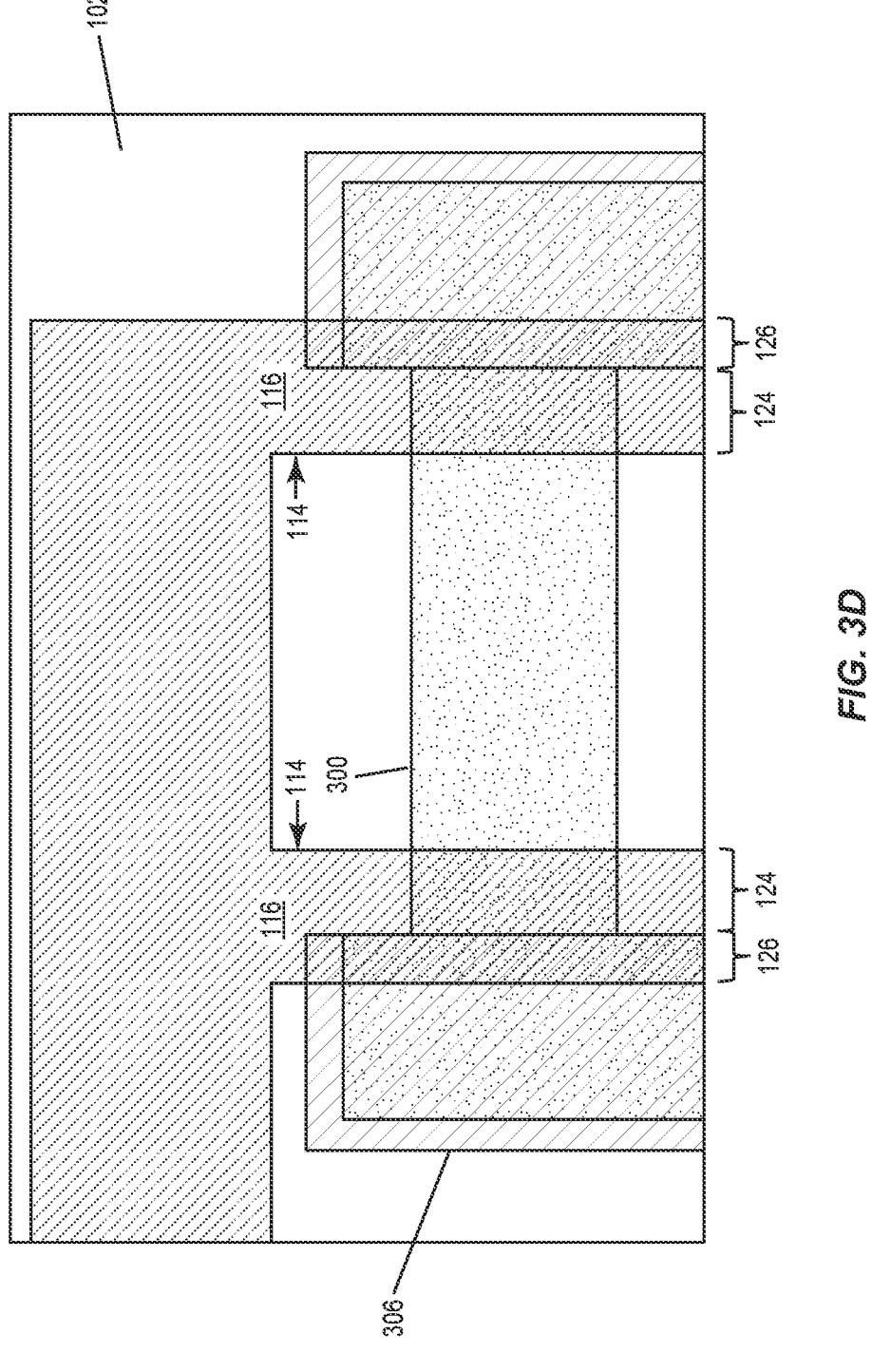

FIG. 3D shows the angled halo implant mask 306. The cross-hatched part of the angled halo implant mask 306 illustrated in FIG. 3D is the part of the mask 306 that allows the dopant species 120 of the second impurity type to be implanted into the surface 110 of the silicon layer 102 and at an angle α relative to the surface 110 to define the body region 122 which includes the channel area 123 formed in the source-facing part 126 of the silicon layer 102 under the gate structures 114. The angled halo implant mask 306 shields the drain-facing part 124 of the silicon layer 102 disposed under each gate structure 114 and exposes the source-facing part 126 of the silicon layer 102 disposed under each gate structure 114. The dopant species 120 of the second impurity type implanted through the angled halo implant mask 306 extends into the source-facing part 126 of the silicon layer 102 but not into the drain-facing part 124 of the silicon layer 102. Exemplary parameters for a halo implant were previously described herein in connection with FIGS. 1C and 2C.

Figure 3E:
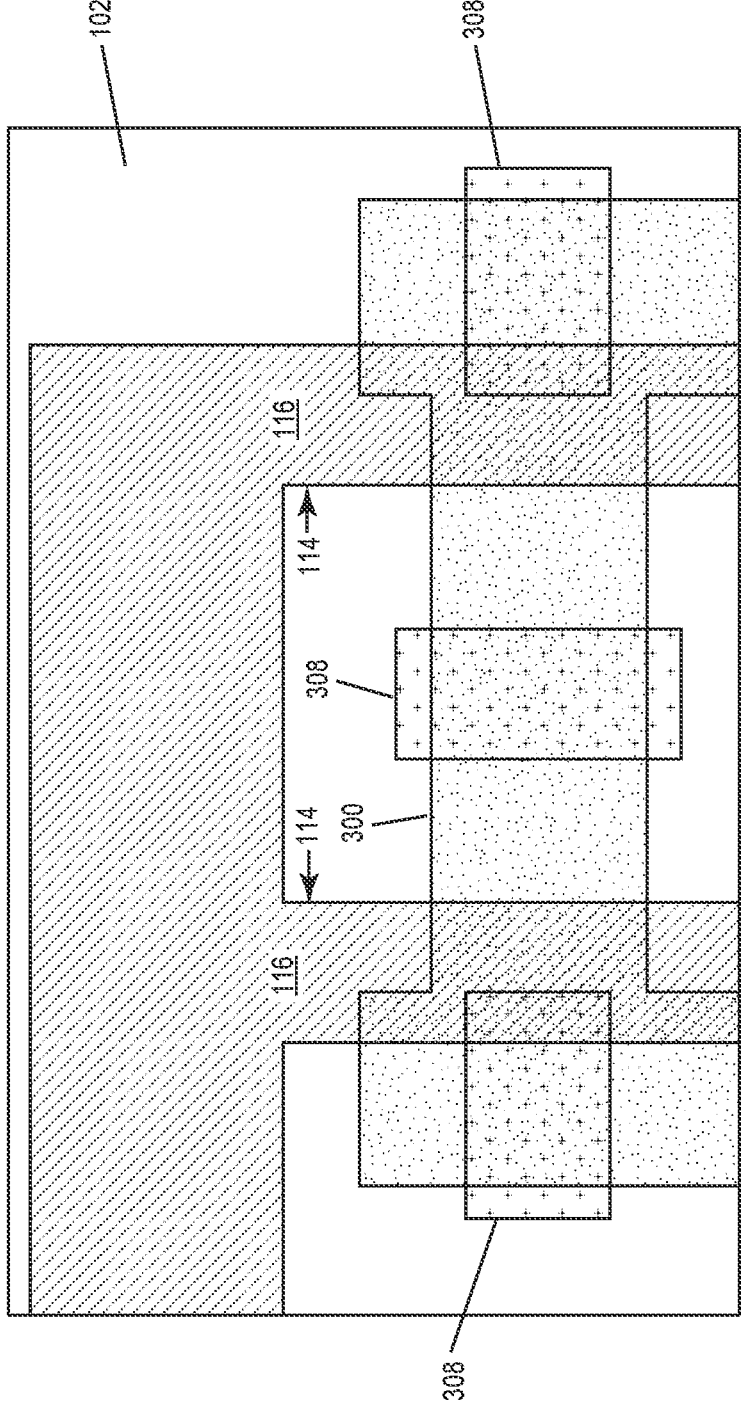

FIG. 3E shows the source/drain implant mask 308. The cross-hatched part of the source/drain mask 308 illustrated in FIG. 3E is the part of the mask 308 that allows the dopant species 128 of the first impurity type to be implanted into the surface 110 of the silicon layer 102 to define the source and drain regions 130, 132 of each transistor cell.

Figure 3F:
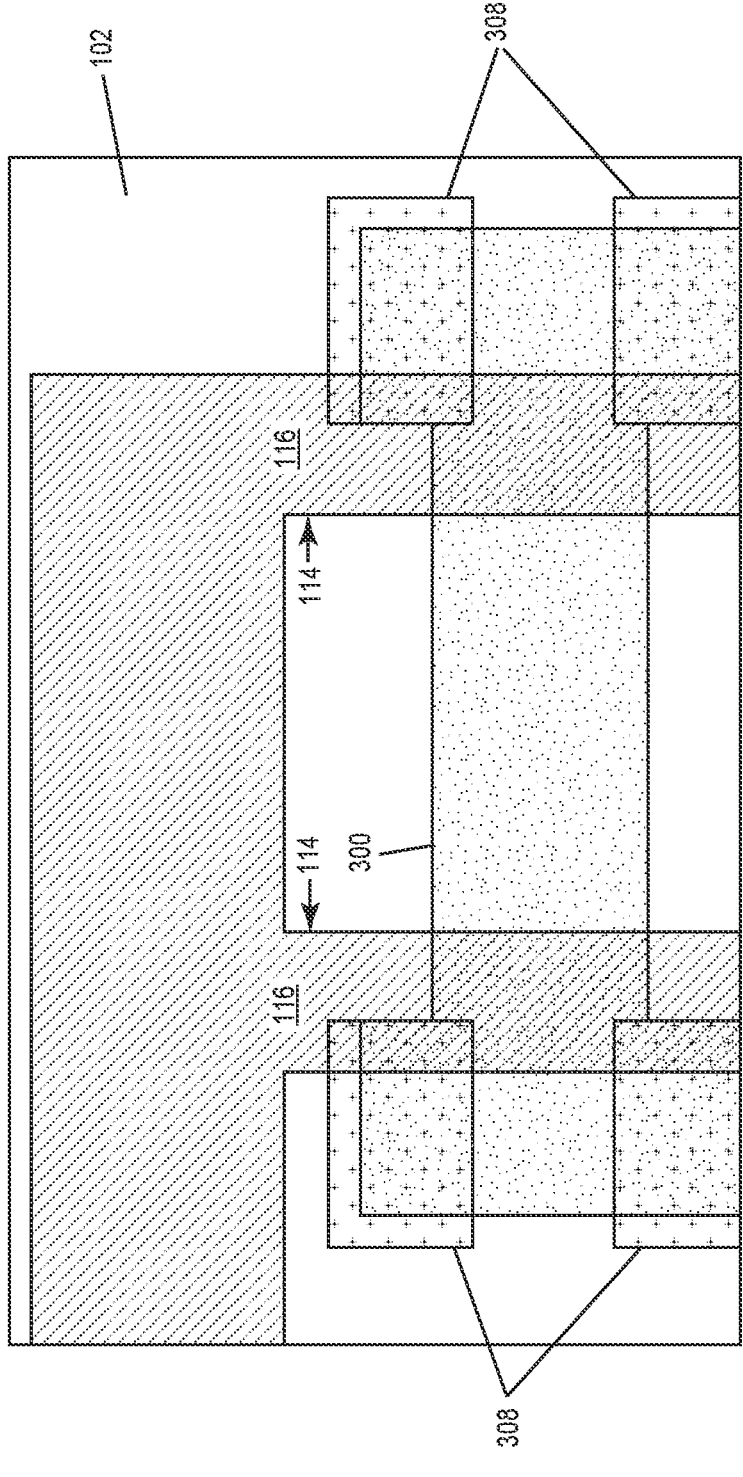

FIG. 3F shows a body contact implant mask 316. The cross-hatched part of the body contact implant mask 316 illustrated in FIG. 3F is the part of the mask 316 that allows a dopant species of the second impurity type to be implanted into the surface 110 of the silicon layer 102 to define the highly doped body contact regions 314 of each transistor cell.

FIGS. 4A through 4F illustrate partial top-down plan views of the implant masks used during the method illustrated in FIGS. 2A through 2D, in a region of two active transistor cells TC. Each transistor cell includes a source region 130 of the first conductivity type in the silicon layer 102 of the SOI substrate 100, a body region 122 of the second conductivity type in the silicon layer 102 and adjoining the source region 130, a gate structure 114 configured to control a channel within a channel area 123 of the body region 122, a drain region 132 of the first conductivity type in the silicon layer 102, and a drift region 112 of the first conductivity type in the silicon layer 102 and laterally separating the body region 122 from the drain region 132. The transistor cells are electrically coupled in parallel to form a power transistor, e.g., via a common source metallization, a common drain metallization, and a common gate metallization. The gate dielectric 118 of each transistor cell has a thickness in a range of 20 nm to 60 nm, the effective length of the channel of each transistor cell is in a range of 50 nm to 500 nm, and the power transistor formed by the transistor cells has a maximum rated voltage in a range of 5V to 60V. As shown in FIGS. 4B through 4F, the device may have stripe-shape gate structures 114 which extend lengthwise in parallel with one another. However, another gate layout may be used.

Figure 4A:
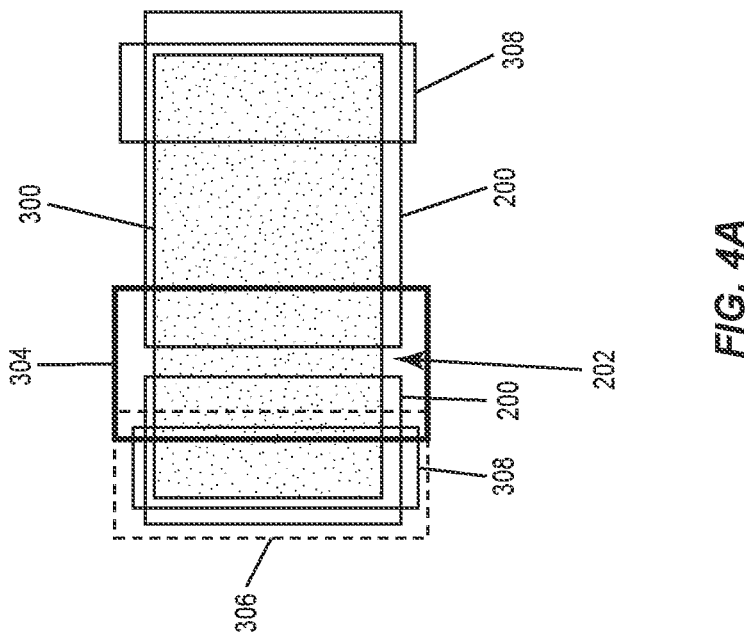
FIGS. 4A through 4F illustrate partial top-down plan views of the implant masks used during the method illustrated in FIGS. 2A through 2D, in a region of two active transistor cells TC.

FIG. 4A schematically shows the implant masks used during the method illustrated in FIGS. 1A through 1D, overlaid with the active area 300 in the region of one transistor cell. The masks used include the patterned drift implant mask 200 illustrated in FIG. 2B, a gate mask 304 for defining the gate structures 114, an angled halo implant mask 306 for defining the body region 122 and corresponding channel area 123, and a source/drain mask 308 for defining the source and drain regions 130, 132. Any standard photolithography process may be used to form the masks 200, 304, 306, 308.

Figure 4B:
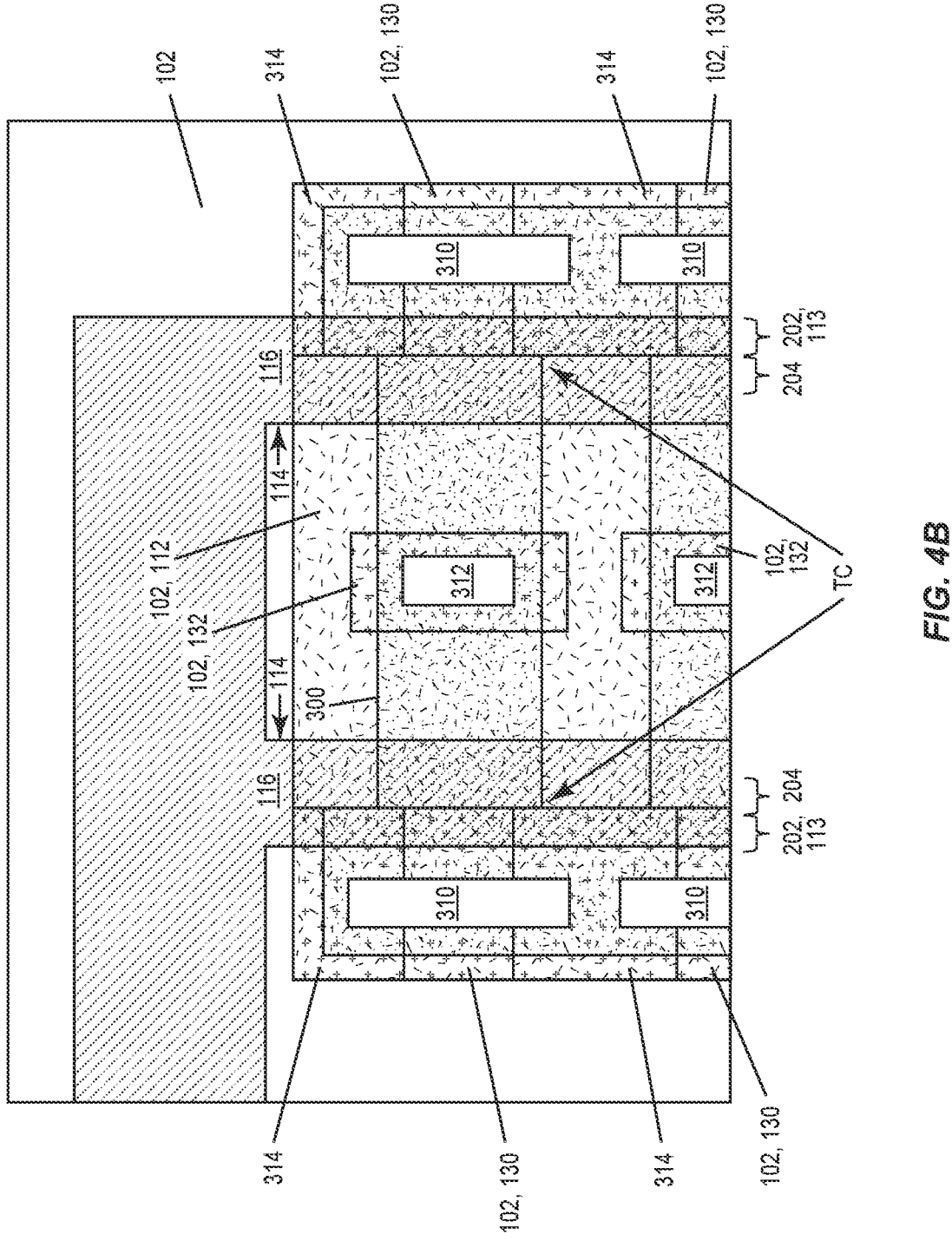

FIG. 4B shows the device produced using the masks 200, 304, 306, 308 shown in FIG. 4A, in a region of two active transistor cells TC. FIG. 4B also shows source/body contacts 310 and drain contacts 312 for the source and drain regions 130, 132, respectively, and highly doped body contact regions 314 formed in the SOI silicon layer 102 for providing an Ohmic connection to the body regions 122 which are out of view in FIG. 3B. FIG. 4B further shows the intrinsic or undoped region 113 that remains under the date structures 114 upon defining the drift region 112 and the corresponding transition region 204 formed by the body implant drive-in anneal.

Figure 4C:
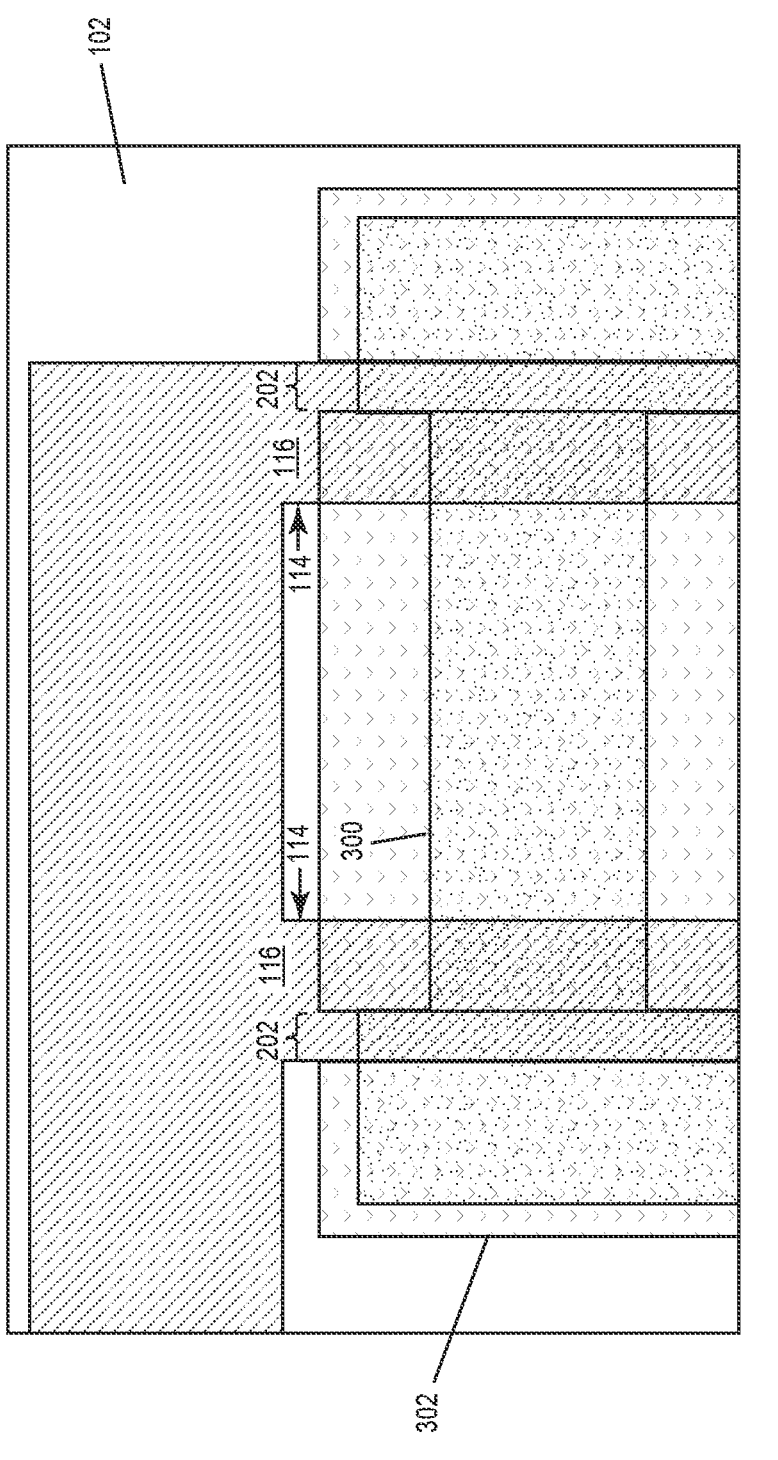

FIG. 4C shows the patterned drift implant mask 200. The cross-hatched part of the patterned drift implant mask 200 illustrated in FIG. 4C is the part of the mask 200 that allows the dopant species 108 of the first impurity type to be implanted into the surface 110 of the silicon layer 102 to define the drift region 112 in the active area 300. The channel pattern 202 of the patterned drift implant mask 200 shields the channel area 123 of each active transistor cell from the dopant species 108 of the first impurity type in the active area 300 of the device to improve channel length control, as previously described herein. As explained above, the drift region 112 may be defined in the silicon layer 102 before formation of the gate structures 114. The gate structures 114 are shown in FIG. 4C as a point of reference.

Figure 4D:
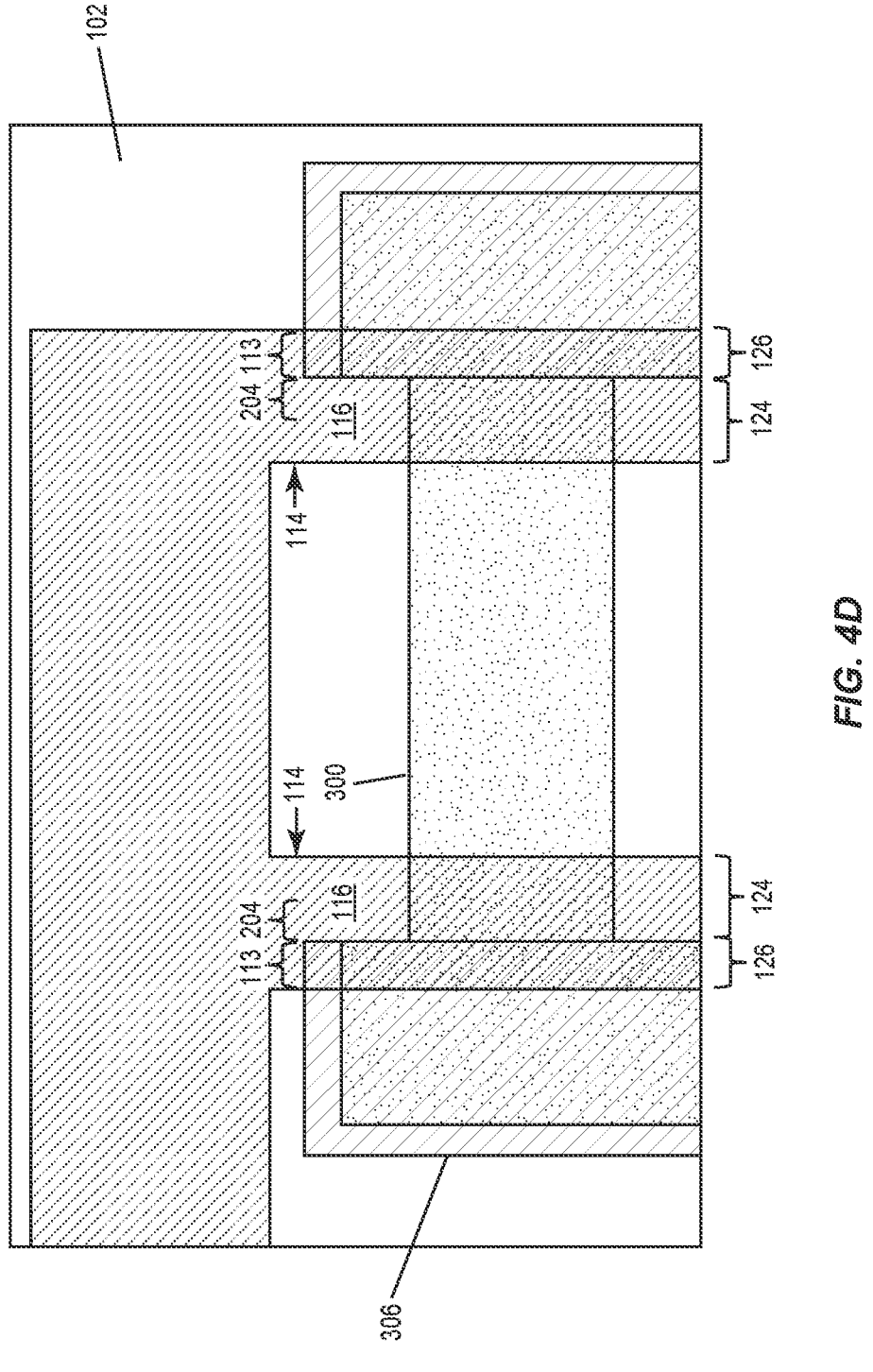

FIG. 4D shows the angled halo implant mask 306. The cross-hatched part of the angled halo implant mask 306 illustrated in FIG. 4D is the part of the mask 306 that allows the dopant species 120 of the second impurity type to be implanted into the surface 110 of the silicon layer 102 and at an angle α relative to the surface 110 to define the body region 122 which includes the channel area 123 formed in the source-facing part 126 of the silicon layer 102 under the gate structures 114. The angled halo implant mask 306 shields the drain-facing part 124 of the silicon layer 102 disposed under each gate structure 114 and exposes the source-facing part 126 of the silicon layer 102 disposed under each gate structure 114. The dopant species 120 of the second impurity type implanted through the angled halo implant mask 306 extends into the source-facing part 126 of the silicon layer 102 but not into the drain-facing part 124 of the silicon layer 102.

Use of the patterned drift implant mask 200 results in a region 113 that was protected from the earlier drift implant and is thus intrinsic or undoped prior to the body implant, as previously explained herein. The angled body implant process implemented using the corresponding mask 306 shown in FIG. 4D results in better dopant control in the intrinsic or undoped region 113 that was protected from the drift implant. FIG. 4D also shows the position of the transition region 204 that is formed in the channel area 123 of each active transistor cell as a result of the body region implant anneal drive-in.

Figure 4E:
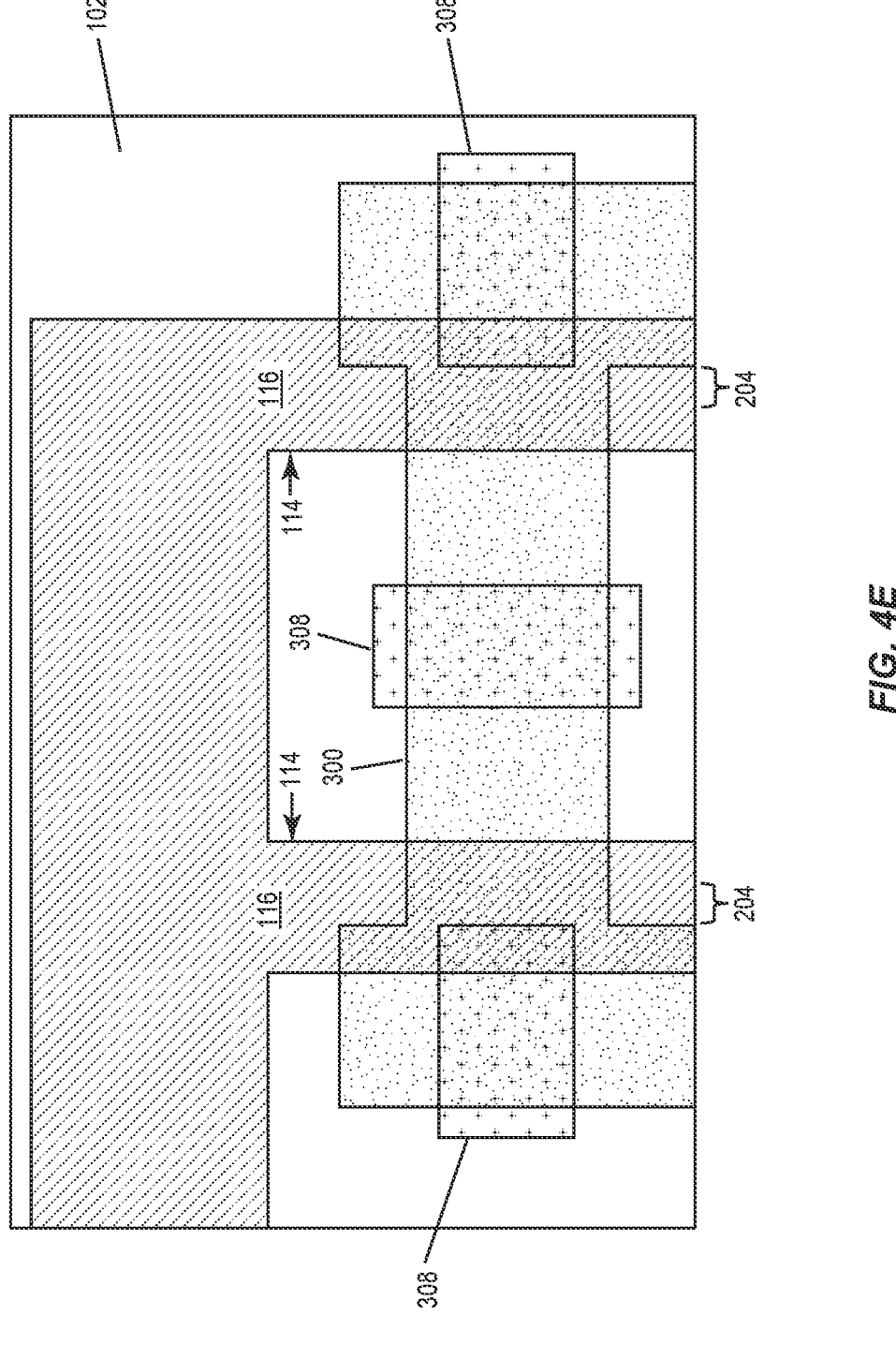

FIG. 4E shows the source/drain implant mask 308. The cross-hatched part of the source/drain mask 308 illustrated in FIG. 4E is the part of the mask 308 that allows the dopant species 128 of the first impurity type to be implanted into the surface 110 of the silicon layer 102 to define the source and drain regions 130, 132 of each transistor cell.

Figure 4F:
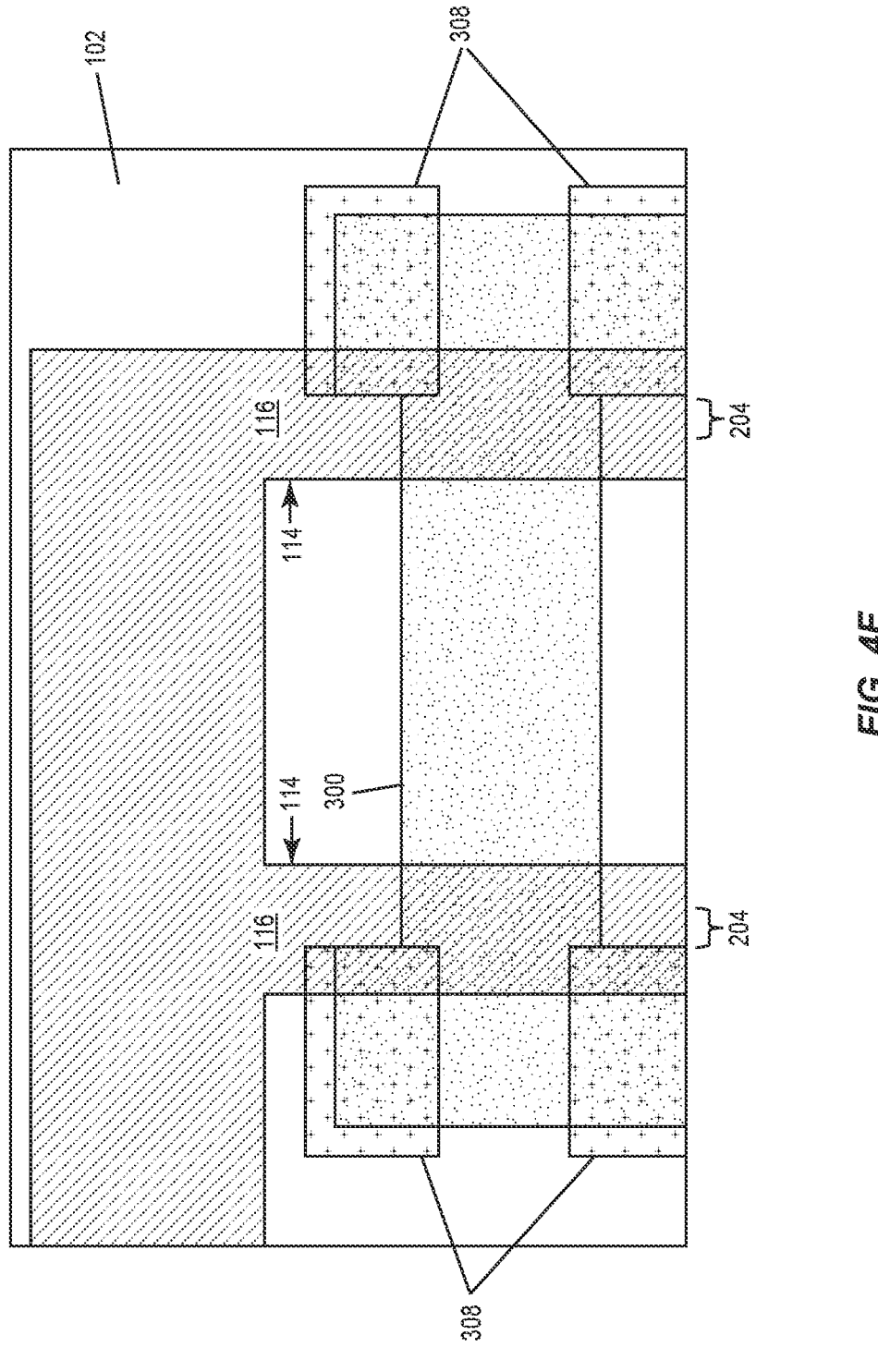

FIG. 4F shows the body contact implant mask 316. The cross-hatched part of the body contact implant mask 316 illustrated in FIG. 4F is the part of the mask 316 that allows a dopant species of the second impurity type to be implanted into the surface 110 of the silicon layer 102 to define the highly doped body contact regions 314 of each transistor cell.

The methods described herein may produce semiconductor devices having a channel/pitch that is reduced by about 20% which directly impacts Cgd (gate-to-drain capacitance). Reduced channel length allows for high current and lower Cgd, improving FOM for power supplies as given by Rdson×Qgd where Rdson is on-state resistance and Qgd is gate charge. Lower Rdson×Qgd allows for improved switching efficiency. Also, the Miller plateau may be improved due to high gain of the switching device. Lower effective channel length yields low Cgd, which in turn results in better FOM expectations.

Although the present disclosure is not so limited, the following numbered examples demonstrate one or more aspects of the disclosure.

Example 1. A semiconductor device, comprising: a silicon-on-insulator (SOI) substrate; and a plurality of transistor cells electrically coupled in parallel to form a power transistor, wherein each transistor cell comprises a source region of a first conductivity type in a silicon layer of the SOI substrate, a body region of a second conductivity type opposite the first conductivity type in the silicon layer and adjoining the source region, a gate structure configured to control a channel within the body region, a drain region of the first conductivity type in the silicon layer, and a drift region of the first conductivity type in the silicon layer and laterally separating the body region from the drain region, wherein each gate structure comprises a gate electrode separated from the silicon layer by a gate dielectric having a thickness in a range of 20 nm to 60 nm, wherein an effective length of the channel of each transistor cell is in a range of 50 nm to 500 nm, wherein the power transistor has a maximum rated voltage in a range of 5V to 60V.

Example 2. The semiconductor device of example 1, wherein the effective length of the channel of each transistor cell is in a range of 50 nm to 100 nm.

Example 3. The semiconductor device of example 1 or 2, wherein the drift region of each transistor cell has a uniform thickness between the body region and the drain region.

Example 4. The semiconductor device of any of examples 1 through 3, wherein the silicon layer has a thickness in a range of 200 nm to 400 nm.

Example 5. The semiconductor device of any of examples 1 through 4, wherein the gate electrode comprises polysilicon and has a thickness in a range of 300 nm to 600 nm, and wherein the gate dielectric comprises oxide and has a thickness in a range of 46 nm+/−20%.

Example 6. A method of producing a semiconductor device, the method comprising: implanting a dopant species of a first impurity type into a surface of a silicon layer of a silicon-on-insulator (SOI) substrate to define a drift region; forming a gate structure that comprises a gate electrode separated from the silicon layer by a gate dielectric having a thickness in a range of 20 nm to 60 nm; after defining the drift region, implanting a dopant species of a second impurity type opposite the first impurity type into the surface of the silicon layer and at an angle relative to the surface to define a body region which extends under part of the gate structure; after implanting the dopant species of the second impurity type, annealing the SOI substrate at a temperature of at least 900° C. for more than 1 minute; and implanting a dopant species of the first impurity type into the surface of the silicon layer to define a source region adjacent the body region and a drain region laterally separated from the body region by the drift region.

Example 7. The method of example 6, wherein implanting the dopant species of the first impurity type into the surface of the silicon layer to define the drift region comprises: before forming the gate structure, forming a blanket implant mask on the surface of the silicon layer and that is devoid of a drift pattern over an active area of the silicon layer; and implanting the dopant species of the first impurity type through the blanket implant mask to define the drift region.

Example 8. The method of example 6, wherein implanting the dopant species of the first impurity type into the surface of the silicon layer to define the drift region comprises: before forming the gate structure, forming a patterned implant mask on the surface of the silicon layer and that includes a channel pattern associated with a channel area; and implanting the dopant species of the first impurity type through the patterned implant mask to define the drift region, wherein the channel pattern of the patterned implant mask shields the channel area from the dopant species of the first impurity type.

Example 9. The method of any of examples 6 through 8, wherein the annealing at a temperature of at least 900° C. is sustained in a range of 30 to 45 minutes.

Example 10. The method of any of examples 6 through 9, wherein implanting the dopant species of the second impurity type into the surface of the silicon layer and at an angle relative to the surface comprises: forming an angled implant mask on the surface of the silicon layer and that shields a drain-facing part of the silicon layer disposed under the gate structure and exposes a source-facing part of the silicon layer disposed under the gate structure; and implanting the dopant species of the second impurity type through the angled implant mask such that the dopant species of the second impurity type extends into the source-facing part of the silicon layer but not into the drain-facing part of the silicon layer.

Example 11. The method of any of examples 6 through 10, wherein the dopant species of the second impurity type is implanted into the surface of the silicon layer at an angle in a range of 40 to 50 degrees relative to the surface.

Example 12. The method of any of examples 6 through 11, wherein a total dose of the dopant species of the second impurity type is delivered to the silicon layer in 4 rotational steps of 45 degrees each, and wherein each rotation delivers a quarter of the total dose to the silicon layer.

Example 13. A method of producing a semiconductor device, the method comprising: implanting a dopant species of a first impurity type into a surface of a silicon layer of a silicon-on-insulator (SOI) substrate to define a drift region for a plurality of transistor cells; forming a gate structure for each transistor cell and that comprises a gate electrode separated from the silicon layer by a gate dielectric having a thickness in a range of 20 nm to 60 nm; after defining the drift region, implanting a dopant species of a second impurity type opposite the first impurity type into the surface of the silicon layer and at an angle relative to the surface to define a body region which extends under part of the gate structure for each transistor cell; after implanting the dopant species of the second impurity type, annealing the SOI substrate at a temperature of at least 900° C. for more than 1 minute; implanting a dopant species of the first impurity type into the surface of the silicon layer to define, for each transistor cell, a source region adjacent the body region and a drain region laterally separated from the body region by the drift region; and electrically coupling the transistor cells in parallel to form a power transistor, wherein an effective channel length for each transistor cell is in a range of 50 nm to 500 nm, wherein the power transistor has a maximum rated voltage in a range of 5V to 60V.

Example 14. The method of example 13, wherein implanting the dopant species of the first impurity type into the surface of the silicon layer to define the drift region for each transistor cell comprises: before forming the gate structure for each transistor cell, forming a blanket implant mask on the surface of the silicon layer and that is devoid of a drift pattern over an active area of the silicon layer allocated for the transistor cells; and implanting the dopant species of the first impurity type through the blanket implant mask to define the drift region for each transistor cell.

Example 15. The method of example 13, wherein implanting the dopant species of the first impurity type into the surface of the silicon layer to define the drift region for each transistor cell comprises: before forming the gate structure for each transistor cell, forming a patterned implant mask on the surface of the silicon layer and that includes a channel pattern associated with a channel area for the transistor cells; and implanting the dopant species of the first impurity type through the patterned implant mask to define the drift region for each transistor cell, wherein the channel pattern of the patterned implant mask shields the channel area for each transistor cell from the dopant species of the first impurity type.

Example 16. The method of any of examples 13 through 15, wherein the annealing at a temperature of at least 900° C. is sustained in a range of 30 to 45 minutes.

Example 17. The method of any of examples 13 through 16, wherein implanting the dopant species of the second impurity type into the surface of the silicon layer and at an angle relative to the surface comprises: forming an angled implant mask on the surface of the silicon layer and that shields a drain-facing part of the silicon layer disposed under the gate structure for each transistor cell and exposes a source-facing part of the silicon layer disposed under the gate structure for each transistor cell; and implanting the dopant species of the second impurity type through the angled implant mask such that the dopant species of the second impurity type extends into the source-facing part of the silicon layer for each transistor cell but not into the drain-facing part of the silicon layer for each transistor cell.

Example 18. The method of any of examples 13 through 17, wherein the dopant species of the second impurity type is implanted into the surface of the silicon layer at an angle in a range of 40 to 50 degrees relative to the surface.

Example 19. The method of any of examples 13 through 18, wherein a total dose of the dopant species of the second impurity type is delivered to the silicon layer in 4 rotational steps of 45 degrees each, and wherein each rotation delivers a quarter of the total dose to the silicon layer.

Example 20. The method of any of examples 13 through 19, wherein the drift region is defined before forming the gate structure.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing a semiconductor device, the method comprising:

implanting a dopant species of a first impurity type into a surface of a silicon layer of a silicon-on-insulator (SOI) substrate to define a drift region;

forming a gate structure that comprises a gate electrode separated from the silicon layer by a gate dielectric having a thickness in a range of 20 nm to 60 nm;

after defining the drift region, implanting a dopant species of a second impurity type opposite the first impurity type into the surface of the silicon layer and at an angle relative to the surface to define a body region which extends under part of the gate structure;

after implanting the dopant species of the second impurity type, annealing the SOI substrate at a temperature of at least 900° C. for more than 1 minute; and implanting a dopant species of the first impurity type into the surface of the silicon layer to define a source region adjacent the body region and a drain region laterally separated from the body region by the drift region.

2. The method of claim 1, wherein implanting the dopant species of the first impurity type into the surface of the silicon layer to define the drift region comprises:

before forming the gate structure, forming a blanket implant mask on the surface of the silicon layer and that is devoid of a drift pattern over an active area of the silicon layer; and implanting the dopant species of the first impurity type through the blanket implant mask to define the drift region.

3. The method of claim 1, wherein implanting the dopant species of the first impurity type into the surface of the silicon layer to define the drift region comprises:

before forming the gate structure, forming a patterned implant mask on the surface of the silicon layer and that includes a channel pattern associated with a channel area; and implanting the dopant species of the first impurity type through the patterned implant mask to define the drift region, wherein the channel pattern of the patterned implant mask shields the channel area from the dopant species of the first impurity type.

4. The method of claim 1, wherein the annealing at a temperature of at least 900° C. is sustained in a range of 30 to 45 minutes.

5. The method of claim 1, wherein implanting the dopant species of the second impurity type into the surface of the silicon layer and at an angle relative to the surface comprises:

forming an angled implant mask on the surface of the silicon layer and that shields a drain-facing part of the silicon layer disposed under the gate structure and exposes a source-facing part of the silicon layer disposed under the gate structure; and implanting the dopant species of the second impurity type through the angled implant mask such that the dopant species of the second impurity type extends into the source-facing part of the silicon layer but not into the drain-facing part of the silicon layer.

6. The method of claim 1, wherein the dopant species of the second impurity type is implanted into the surface of the silicon layer at an angle in a range of 40 to 50 degrees relative to the surface.

7. The method of claim 1, wherein a total dose of the dopant species of the second impurity type is delivered to the silicon layer in 4 rotational steps of 45 degrees each, and wherein each rotation delivers a quarter of the total dose to the silicon layer.

8. A method of producing a semiconductor device, the method comprising:

implanting a dopant species of a first impurity type into a surface of a silicon layer of a silicon-on-insulator (SOI) substrate to define a drift region for a plurality of transistor cells;

forming a gate structure for each transistor cell and that comprises a gate electrode separated from the silicon layer by a gate dielectric having a thickness in a range of 20 nm to 60 nm;

after defining the drift region, implanting a dopant species of a second impurity type opposite the first impurity type into the surface of the silicon layer and at an angle relative to the surface to define a body region which extends under part of the gate structure for each transistor cell;

after implanting the dopant species of the second impurity type, annealing the SOI substrate at a temperature of at least 900° C. for more than 1 minute;

implanting a dopant species of the first impurity type into the surface of the silicon layer to define, for each transistor cell, a source region adjacent the body region and a drain region laterally separated from the body region by the drift region; and electrically coupling the transistor cells in parallel to form a power transistor, wherein an effective channel length for each transistor cell is in a range of 50 nm to 500 nm, wherein the power transistor has a maximum rated voltage in a range of 5V to 60V.

9. The method of claim 8, wherein implanting the dopant species of the first impurity type into the surface of the silicon layer to define the drift region for each transistor cell comprises:

before forming the gate structure for each transistor cell, forming a blanket implant mask on the surface of the silicon layer and that is devoid of a drift pattern over an active area of the silicon layer allocated for the transistor cells; and implanting the dopant species of the first impurity type through the blanket implant mask to define the drift region for each transistor cell.

10. The method of claim 8, wherein implanting the dopant species of the first impurity type into the surface of the silicon layer to define the drift region for each transistor cell comprises:

before forming the gate structure for each transistor cell, forming a patterned implant mask on the surface of the silicon layer and that includes a channel pattern associated with a channel area for the transistor cells; and implanting the dopant species of the first impurity type through the patterned implant mask to define the drift region for each transistor cell, wherein the channel pattern of the patterned implant mask shields the channel area for each transistor cell from the dopant species of the first impurity type.

11. The method of claim 8, wherein the annealing at a temperature of at least 900° C. is sustained in a range of 30 to 45 minutes.

12. The method of claim 8, wherein implanting the dopant species of the second impurity type into the surface of the silicon layer and at an angle relative to the surface comprises:

forming an angled implant mask on the surface of the silicon layer and that shields a drain-facing part of the silicon layer disposed under the gate structure for each transistor cell and exposes a source-facing part of the silicon layer disposed under the gate structure for each transistor cell; and implanting the dopant species of the second impurity type through the angled implant mask such that the dopant species of the second impurity type extends into the source-facing part of the silicon layer for each transistor cell but not into the drain-facing part of the silicon layer for each transistor cell.

13. The method of claim 8, wherein the dopant species of the second impurity type is implanted into the surface of the silicon layer at an angle in a range of 40 to 50 degrees relative to the surface.

14. The method of claim 8, wherein a total dose of the dopant species of the second impurity type is delivered to the silicon layer in 4 rotational steps of 45 degrees each, and wherein each rotation delivers a quarter of the total dose to the silicon layer.

15. The method of claim 8, wherein the drift region is defined before forming the gate structure.

* * * * *